US011430624B2

(12) United States Patent
Miller et al.

(10) Patent No.: US 11,430,624 B2
(45) Date of Patent: Aug. 30, 2022

(54) CURRENT SENSOR OUTPUT CONVERTER FOR CIRCUIT BREAKERS THAT ARE CONFIGURED FOR ROGOWSKI COILS

(71) Applicant: Eaton Intelligent Power Limited, Dublin (IE)

(72) Inventors: Theodore J. Miller, Oakdale, PA (US); David R. Olenak, Bridgeville, PA (US); Zachary Mueller, Aliquippa, PA (US)

(73) Assignee: EATON INTELLIGENT POWER LIMITED, Dublin (IE)

( * ) Notice: Subject to any disclaimer, the term of this patent is extended or adjusted under 35 U.S.C. 154(b) by 272 days.

(21) Appl. No.: 16/797,051

(22) Filed: Feb. 21, 2020

(65) Prior Publication Data

US 2021/0193423 A1 Jun. 24, 2021

Related U.S. Application Data

(60) Provisional application No. 62/951,092, filed on Dec. 20, 2019.

(51) Int. Cl.
| | | |
|---|---|---|
| *H02H 3/08* | (2006.01) | |
| *H01H 71/12* | (2006.01) | |
| *H01H 47/22* | (2006.01) | |
| *G01R 19/00* | (2006.01) | |
| *H02H 1/04* | (2006.01) | |
| *H01H 83/20* | (2006.01) | |

(52) U.S. Cl.
CPC ....... *H01H 71/123* (2013.01); *G01R 19/0007* (2013.01); *H01H 47/223* (2013.01); *H01H 83/20* (2013.01); *H02H 1/046* (2013.01); *H02H 3/08* (2013.01)

(58) Field of Classification Search
CPC .... H01H 71/04; H01H 71/123; H01H 71/125; H01H 71/22; H01H 9/50; H01H 9/54; H01H 9/167; H02H 1/0015; H02H 1/046; H02H 1/334; H02H 1/347; H02H 1/34; H02H 1/083; H02H 1/0935; H02H 1/283; H02H 1/33; H02H 1/021; H02H 1/40; H02H 1/093; H02H 1/08; H02H 1/006; H02H 1/00; H02H 1/087; H02H 1/105
See application file for complete search history.

(56) References Cited

U.S. PATENT DOCUMENTS

| 4,535,959 A | * | 8/1985 | Gilcher | .................. B61L 1/187 246/122 R |
|---|---|---|---|---|
| 9,379,537 B2 | | 6/2016 | Hulse | |
| 9,842,709 B2 | | 12/2017 | Zheng et al. | |
| 9,947,496 B2 | | 4/2018 | Niehoff | |

(Continued)

OTHER PUBLICATIONS

Kojovic, L.A. et al., "Practical Aspects of Rogowski Coil Applications to Relaying", IEEE PSRC Special Report, Sep. 2020.

(Continued)

*Primary Examiner* — Bryan R Perez

(74) *Attorney, Agent, or Firm* — Eckert Seamans Cherin & Mellott, LLC

(57) ABSTRACT

In a circuit breaker arrangement, this disclosure describes a method and circuit design enables a current transformer to be used to detect ground faults in circuit breakers (such as a main-tie-main circuit breakers) that have been designed to receive signals from Rogowski coils.

22 Claims, 5 Drawing Sheets

(56) References Cited

U.S. PATENT DOCUMENTS

| | | | |
|---|---|---|---|
| 2004/0070278 A1* | 4/2004 | Divan | H02J 3/0073 |
| | | | 307/64 |
| 2010/0008000 A1 | 1/2010 | Riley et al. | |
| 2015/0112499 A1 | 4/2015 | Hulse | |
| 2015/0377930 A1* | 12/2015 | Youn | H01F 38/30 |
| | | | 361/87 |

OTHER PUBLICATIONS

Ground fault isolation with loads fed from separately derived grounded sources, Eaton White Paper, Dec. 2013.

Castenschiold, R., "Ground-Fault Protection of Electrical Systems with Emergency or Standby Power," IEEE Transactions on Industry Applications, IEEE Service Center, Piscataway, NJ, US, vol. 43, No. 6, Nov. 1, 1977, pp. 517-523.

Hazel, T.G. et al., "Implementing Back-Up Protection Using Microprocessor Based Multifunction Relays," Industry Applications Society 48th Annual Petroleum and Chemical Industry Conference; vol. Conf. 48, Sep. 24, 2001, pp. 53-62.

Wester, C. et al., "Efficient Applications of Bus Transfer Schemes," Pulp and Paper Industry Technical Conference; Conference Record of 2010 Annual, IEEE, Piscataway, NJ, Jun. 21, 2010, pp. 1-8.

\* cited by examiner

US 11,430,624 B2

CURRENT SENSOR OUTPUT CONVERTER FOR CIRCUIT BREAKERS THAT ARE CONFIGURED FOR ROGOWSKI COILS

RELATED APPLICATIONS AND CLAIM OF PRIORITY

This patent document claims priority to U.S. Provisional Patent Application No. 62/951,092, filed Dec. 20, 2019, the disclosure of which is fully incorporated into this document by reference.

BACKGROUND

This disclosure generally relates to circuit breakers for electrical circuits. More particularly, this disclosure relates to methods and systems that enable the use of current transformers with alternating current (AC) circuit breakers that are designed to incorporate Rogowski coils instead of current transformers.

Main-tie-main system configurations are commonly used to provide redundancy and reliability in electrical power delivery systems. A basic example of a main-tie-main system 100 configuration is illustrated in FIG. 1, where two power sources 101, 102 are interconnected to deliver power to two loads 121, 122. A first circuit breaker 131 is connected to the output of the first power source 101, and a second circuit breaker 132 is connected to the output of the second power source 102. In addition to being electrically connected to their corresponding loads, the outputs of the first and second circuit breakers 101, 102 are interconnected by a bus 105 that includes a tie circuit breaker 133 that can make or break the electrical path that the bus 105 provides between the first and second circuit breakers 101, 102.

In normal operation, the tie circuit breaker 133 is open, and the system operates as two independent circuits, with each source 101, 102 delivering power to its corresponding load 121, 122. However, when a fault occurs on one of the circuits, that circuit's breaker will trip, and the tie circuit breaker 133 will quickly close so that the other circuit's source may continue to supply power to both loads with little if any interruption in power delivery. For example, in FIG. 1 if a fault occurs in the circuit formed by source 102 and load 122, circuit breaker 132 will open and the tie circuit breaker 133 will close. When the fault is cleared, the faulted circuit's breaker 132 will close and the tie circuit breaker 133 will open, restoring normal operation in which each source delivers power to its corresponding load.

In main-tie-main systems such as that shown in FIG. 1, the neutral conductor of each source 101, 102 is typically connected to ground and is not connected to the source's corresponding circuit breaker. Thus, multiple ground paths 141, 142 are present, with a path existing for each source. To detect a fault, the system must be able to accurately determine the ground fault current flowing in each circuit breaker 131, 132. This is important so that the system can determine which breaker (131 or 132) should open to clear the fault.

This document describes methods and systems that are directed to addressing the issues described above.

SUMMARY

In some embodiments, a converter circuit receives signals from one or more current transformers and outputs a signal to a circuit breaker trip unit. The converter circuit includes: an input component that is electrically connected to receive an output signal from each of the current transformers of a circuit breaker; a burden resistor that is electrically connected across a coil of the input component; a passive differentiator that is electrically connected across the burden resistor, wherein the passive differentiator comprises a resistor and a capacitor; and an output. The output is configured to deliver, from the passive differentiator during operation, a converted output voltage that is proportional to the time rate of change of a signal that is received by the input component.

Optionally, the input component of the converter circuit includes a current transformer, and the coil of the input component across which the burden resistor is electrically connected comprises a secondary coil of the current transformer.

Optionally, a resistance value of the resistor of the passive differentiator may be substantially less than an impedance value of the capacitor of the passive differentiator at any given operating frequency.

Optionally, the converter circuit also may include an inductor that has one end that is electrically connected to a circuit reference and serves to add phase shift lost at a high end of an operating range of the converter circuit.

Optionally, the circuit breaker may be a component of a main-tie-main system. If so, then the input component may be electrically connected to multiple current transformers of the main-tie-main system. Each of the current transformers of the main-tie-main system may be configured to detect current output by one or more neutral lines of a corresponding source that is electrically connected to the main-tie-main system.

Optionally, the converter circuit may not require a power source to deliver, from the passive differentiator during operation, the converted output.

In other embodiments, an electrical system includes: a first power source; a first circuit breaker that is electrically connected to an output of the first power source; a first trip unit for the first circuit breaker; and a first current transformer that is positioned to detect current passing through a neutral line that extends from the first power source; and a first converter circuit. The first converter circuit is positioned to receive a signal from the output of one or more current transformers, convert the received signal to a first voltage signal, and send the first voltage signal to the first trip unit. During operation, the first voltage signal will have a voltage that is proportional to a time rate of change of the received signal.

Optionally, in such embodiments the first converter circuit may include: an input component that is electrically connected to receive the first signal from the first current transformer; a burden resistor that is electrically connected across a coil of the input component; and a passive differentiator that is electrically connected across the burden resistor. The passive differentiator may include a resistor and a capacitor. The output of the current converter may be configured to deliver, from the passive differentiator during operation, the first voltage signal.

Optionally, the system may be a main-tie-main system that also includes: a second power source; a second circuit breaker that is electrically connected to an output of the second power source; a second trip unit for the second circuit breaker; and a second current transformer that is positioned to detect current passing through a neutral line that extends from the second power source; and a second converter circuit. The second converter circuit may be positioned to receive a signal from the output of the second current transformer, convert the signal received from the output of the second current transformer to a second voltage signal, and send the second voltage signal to the second trip unit. The system also may include a third circuit breaker that is electrically connected to both the first power source and the second power source. The neutral lines that extend from the first power source and the second power source may be electrically connected to each other, and each of the first and second converter circuits may be electrically connected to each of the neutral lines.

Optionally, the input component of the first converter circuit may include a current transformer, and the coil across which the burden resistor is electrically connected may be a secondary winding of the current transformer.

Optionally, a resistance value of the resistor of the passive differentiator may be substantially less than an impedance value of the capacitor of the passive differentiator at any given operating frequency.

Optionally, the first converter circuit also may include an inductor that has one end that is electrically connected to a circuit reference and that serves to add phase shift lost at the high end of the operating range.

Optionally, the first converter circuit does not require a power source to convert the signal that it receives from the one or more current transformers to the first higher voltage signal.

In other embodiments, an electrical system having a main-tie-main configuration includes: (i) a first power source; (ii) a first circuit breaker that is electrically connected to an output of the first power source; (iii) a first trip unit for the first circuit breaker; (iv) a first current transformer that is positioned to detect current passing through a neutral line that extends from the first power source; (v) a second power source; (vi) a second circuit breaker that is electrically connected to an output of the second power source; (vii) a second trip unit for the second circuit breaker; (viii) a second current transformer that is positioned to detect current passing through a neutral line that extends from the second power source; (ix) a third circuit breaker that is electrically connected to both the first power source and the second power source; (x) a first converter circuit that is positioned to receive signals from the first and second current transformers, sum and convert the signals received from the output of the first and second current transformers to a first voltage signal, and send the first voltage signal to the first trip unit so that during operation the first voltage signal will have a rate of change that is proportional to a rate of change of the signals received by the first converter circuit; and (xi) a second converter circuit that is positioned to receive signals from the first and second current transformers, sum and convert the signals received from the output of the first and second current transformers to a second voltage signal, and send the second higher voltage signal to the second trip unit so that during operation the second voltage signal will have a rate of change that is proportional to a rate of change of the signals received by the second converter circuit.

Optionally, each of the converter circuits may include: an input component that is electrically connected to receive the output signal from the applicable current transformer; a burden resistor that is electrically connected across a coil of the input component; and a passive differentiator that is electrically connected across the burden resistor. The passive differentiator may include a resistor and a capacitor. The output of the converter circuit may be configured to deliver, from the passive differentiator during operation, the applicable voltage signal.

Optionally, the neutral lines that extend from the first power source and the second power source may be electrically connected to each other, and each of the first and second converter circuits may be electrically connected to each of the neutral lines.

Optionally, the input component of the each converter circuit may include a current transformer, and the coil across which the burden resistor is electrically connected in each converter circuit may be a secondary winding of the current transformer of that converter circuit.

Optionally, a resistance value of the resistor of the passive differentiator of each converter circuit is substantially less than an impedance value of the capacitor of the passive differentiator of that converter circuit at any given operating frequency.

Optionally, each converter circuit also includes an inductor that has one end that is electrically connected to a circuit reference and that serves to add phase shift lost at a high end of an operating range of the converter circuit.

Optionally, neither of the converter circuits requires a power source to convert the signal that it receives to the applicable voltage signal.

In other embodiments, a converter for receiving signals from one or more current transformers and outputting a signal to a circuit breaker trip unit includes: (a) an input component that is electrically connected to receive an output signal from each of one or more current transformers of a circuit breaker; (b) a burden resistor that is electrically connected across a coil of the input component; and (c) a circuit that is electrically connected across the burden resistor and that is configured to deliver, during operation, a converted output voltage that is proportional to time rate of change of current that is received by the input component.

Optionally, the circuit may include an inductor. In addition or alternatively, the circuit may include a passive differentiator.

DETAILED DESCRIPTION

As used in this document, the singular forms "a," "an," and "the" include plural references unless the context clearly dictates otherwise. Unless defined otherwise, all technical and scientific terms used herein have the same meanings as commonly understood by one of ordinary skill in the art. As used in this document, the term "comprising" (or "comprises") means "including (or includes), but not limited to." When used in this document, the term "exemplary" is intended to mean "by way of example" and is not intended to indicate that a particular exemplary item is preferred or required.

In this document, when terms such "first" and "second" are used to modify a noun, such use is simply intended to distinguish one item from another, and is not intended to require a sequential order unless specifically stated. The term "approximately," when used in connection with a numeric value, is intended to include values that are close to, but not exactly, the number. For example, in some embodiments, the term "approximately" and "about" may include values that are within +/−10 percent of the value.

In this document, the term "electrically connected", when referring to two electrical components, means that a conductive path exists between the two components. The path may be a direct path, or an indirect path through one or more intermediary components.

Figure 1:
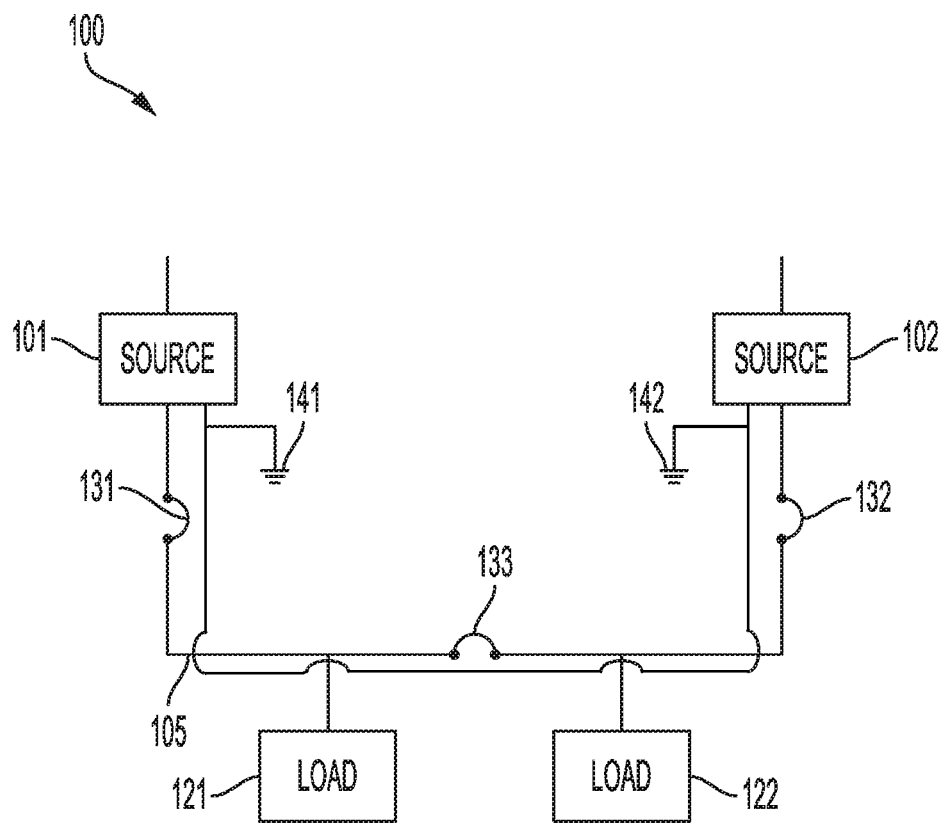
FIG. 1 illustrates a main-tie-main configuration of an electrical system, such as may exist in the prior art.
Figure 2:
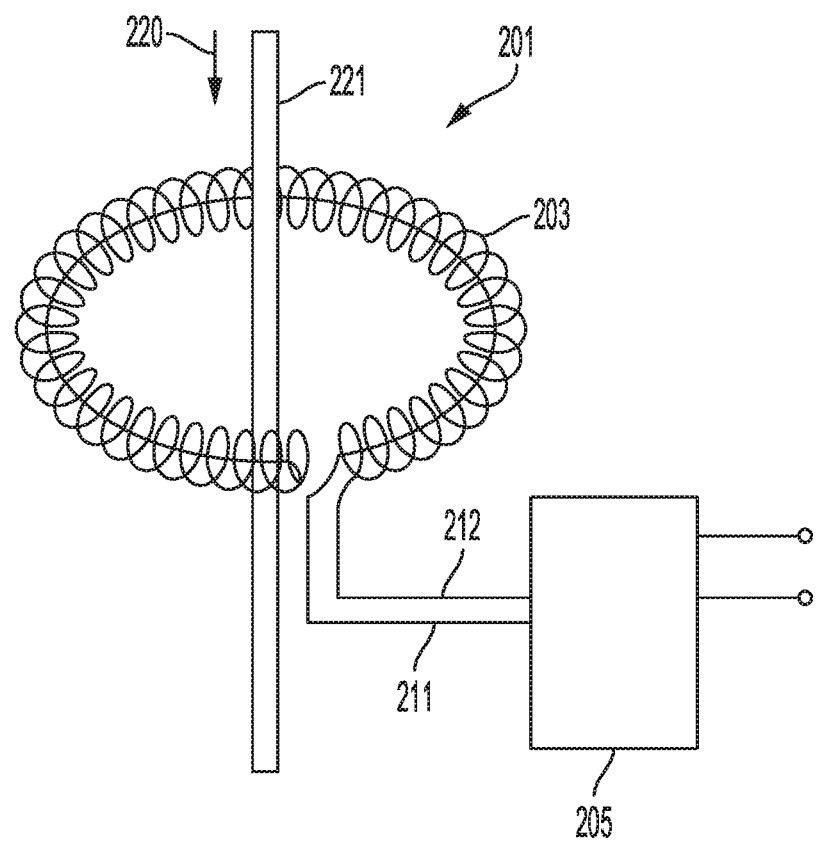
FIG. 2 illustrates a configuration of a Rogowski coil, such as may exist in the prior art.

To sense current flowing through a circuit breaker and thus detect ground faults as described in the Background above, main-tie-main systems such as that shown in FIG. 1 typically use a current transformer or a Rogowski coil. Referring to FIG. 2, a Rogowski coil 201 is helical coil 203 of wire that is structured so that one end of the wire returns through the center of the coil to the other end, so that both terminals 211, 212 are at the same end of the coil. A Rogowski coil can be used to measure AC current 220 of a conductor 221 that passes through the center of the coil 203. The voltage that is induced in the coil 203 is proportional to the rate of change of current in the conductor 221. Thus, the output of the Rogowski coil 201 is a voltage that is proportional to the time rate of change of current in the conductor 221. This output is electrically connected to a circuit 205 that integrates the Rogowski coil's output to produce a signal that is proportional to the current that is passing through the conductor.

Unlike a current transformer which has a magnetic core, Rogowski coils are wound around a non-magnetic core that is most typically air or some type of plastic. Rogowski coils have several advantages over current transformers. For example, they can respond to very quickly-changing currents due to their low inductance, they typically cost less than conventional current transformers, and for high-current applications they are smaller than conventional current transformers. Thus, many modern circuit breakers are designed to receive output signals only from Rogowski coils, and not from traditional current transformers.

However, in some applications Rogowski coils may provide disadvantages. For example, the accuracy of a Rogowski coil can be very sensitive to the positioning of the conductor within the coil. Further, the output signals from Rogowski coils have a very low level and cannot easily be summed by any breaker's trip unit. For example, the voltage level output by many commonly available Rogowski coils is often between 20-150 millivolts (mV) per 1000 amps (A) of sensed current.

Thus, this disclosure describes a method and system configuration that enables a current transformer to be used to detect ground faults in circuit breakers (such as a main-tie-main circuit breakers) that have been designed to receive signals from Rogowski coils. In some embodiments, the configuration disclosed below may be completely passive in that it does not require a power supply to measure ground fault current. Thus, it may provide a way to convert a current transformer's output voltage into a current rate of change (di/dt) signal, such as that which would have been output by a Rogowski coil, without requiring an integrated circuit or other powered component.

Figure 3:
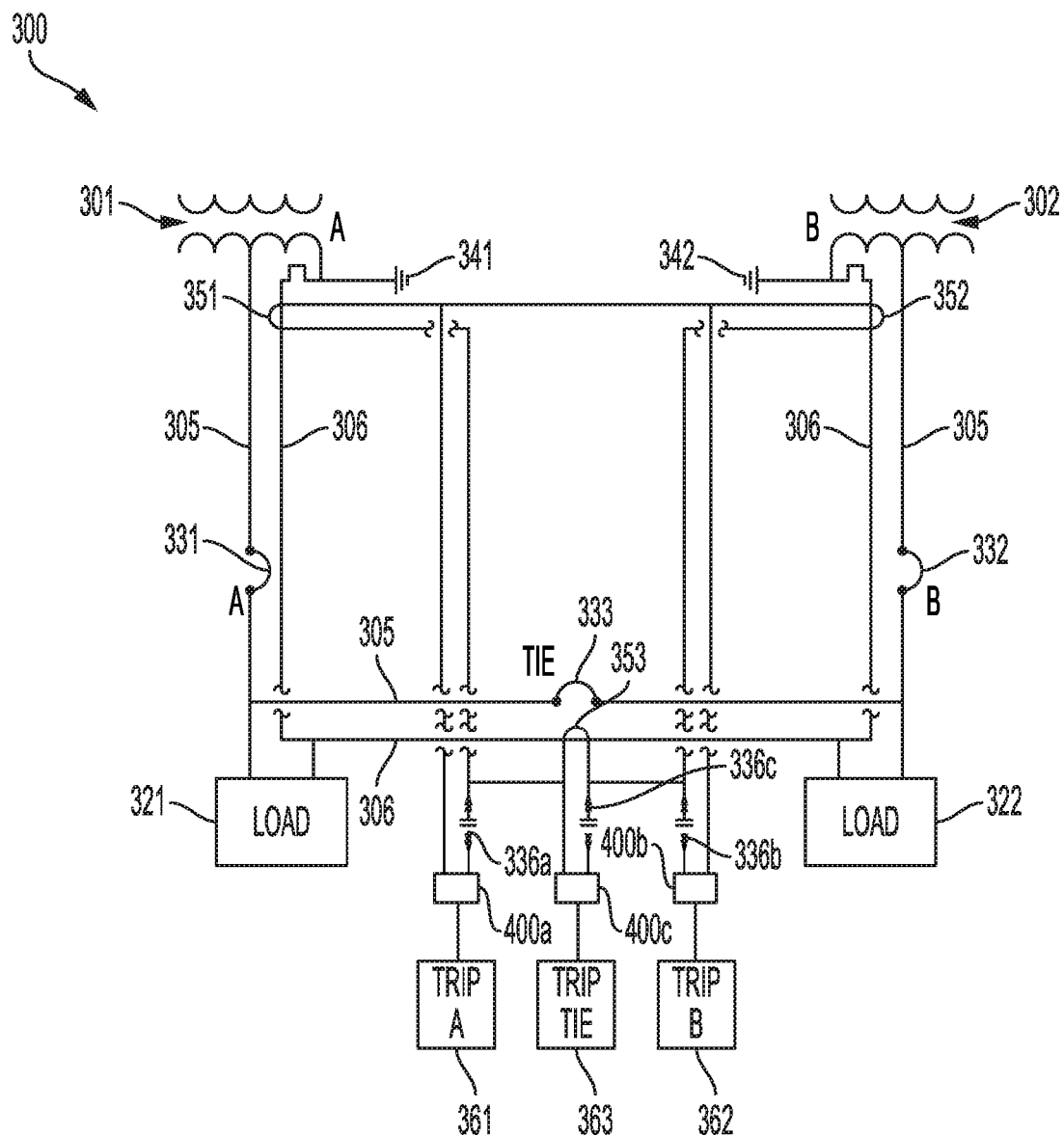
FIG. 3 illustrates a main-tie-main configuration in which current transformers are used to sense current at multiple points in the system, and in which multiple trip units use the outputs of each current transformer output to determine when to trip a corresponding circuit breaker.

FIG. 3 illustrates an example main-tie-main circuit breaker 300 configuration in which each source (power transformers 301, 302) has its own path to ground 341, 342. A power circuit 305 electrically connects the three phases of each power transformer 301, 302 to the loads 321, 322. A neutral circuit 306 electrically connects the neutrals of each power transformer 301, 302 and the loads 321, 322. The neutral circuit in many applications does not pass through a circuit breaker and is thus not broken when any of the circuit breakers 331, 332 or 333 opens. A first current sensor 351 is positioned along the neutral line leading from power transformer A 301 to the trip unit A 361 for the first transformer's circuit breaker A 331. A second current sensor 352 is positioned along the neutral line leading from power transformer B 302 to the trip unit B 362 for the second transformer's circuit breaker B 332. A third current sensor 353 is positioned along the neutral line that interconnects the neutrals of and power transformer A 301 and power transformer B 302. Depending on which of the breakers 331, 332, or 333 are closed, the trip unit's need to sum currents from multiple transformers to properly measure system ground fault currents.

Figure 4:
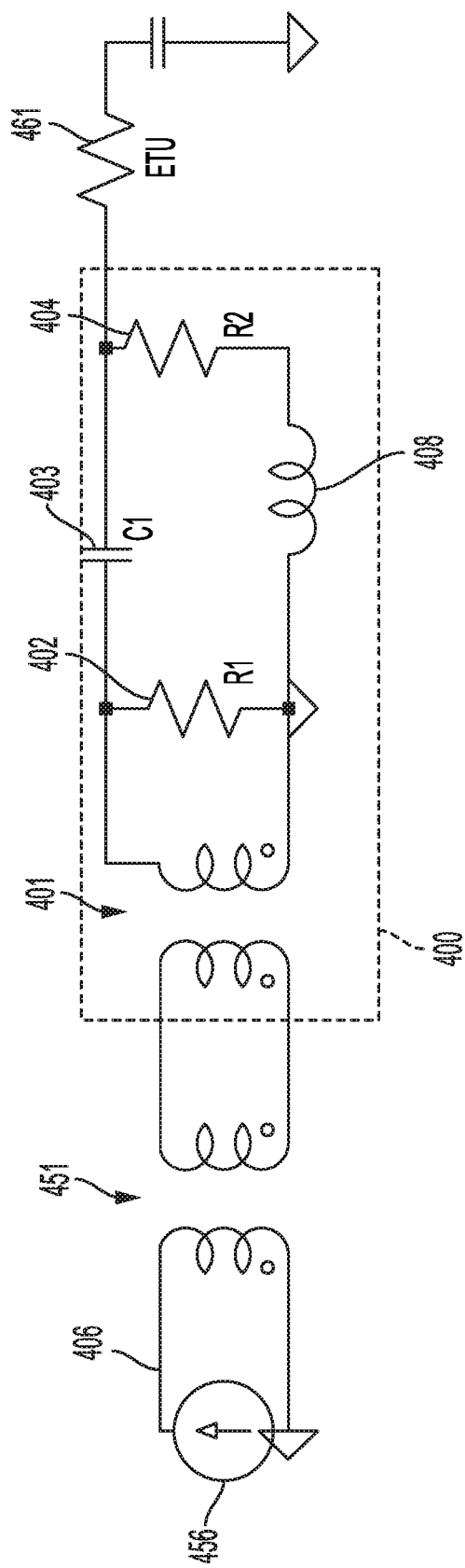
FIG. 4 illustrates an example converter circuit that can be used to convert current transformer output signals in a configuration such as that shown in FIG. 3.

In this configuration, the current sensors 351, 352, 353 are current transformers. In prior art systems, the trip units would have been designed to receive the output of such current transformers. However, modern trip units are designed to receive an input that is proportional to the rate of change of current, such as the output signals from Rogowski coils. Therefore, unlike prior art systems, to enable the trip units to accept the output signals from the current transformers' outputs, in FIG. 3 each trip unit includes or is electrically connected to a converter circuit 400a, 400b, 400c that sums and converts the signals output by the current transformers into a signal that the corresponding trip unit may use. Example details of such a converter circuit are shown in FIG. 4. Each trip unit also may be associated with a contact 336a, 336b, 336c that is will open and close with the breaker that is associated with the trip unit, to help ensure that the corresponding converter circuit only sums those currents that need to be summed.

Referring to FIG. 4, a current transformer 451 of a circuit breaker is positioned along the neutral line 406 output of a power source to sense current along the neutral line 406. In the context of a circuit such as that of FIG. 3, current transformer 451 of FIG. 4 may correspond to current transformer 351 or 352 of FIG. 3, and it may have a current ratio of about 4000:1 (meaning that it will output a signal of 1 amp for every 4000 amps of current sensed in its primary winding). Other current ratios are possible depending on the requirements of the particular installation.

In each circuit breaker's trip unit, or operably connected to each circuit breaker's trip unit, a converter circuit 400 may be provided to receive the outputs of the each current transformer in the system, sum the outputs, and a yield a signal that both (a) reflects the rate of change in the current passing through the input to the converter and (b) exhibits a voltage level that can be used by the breaker's trip unit without amplification by a powered component such as an integrated circuit and matches the output of Rogowski coils inside the breaker used to measure the phase currents. While FIG. 4 shows only one current transformer 451 electrically connected to the converter circuit 400, in practice the outputs of other current transformers can be electrically connected to each converter circuit, such as in the configuration shown in FIG. 3 with converter circuits 400a-400c. The current transformer(s) 451 therefore also may provide isolation so that all references leading to the converter circuit 400 are not electrically connected to each other.

The converter circuit 400 may include a current transformer 401 that further decreases the output current of the circuit breaker current transformers to a lower level, such as an increase of a ratio of 36.1:1. The current transformer 401 also may provide isolation so that the references in all trip units are not tied together. A burden resistor 402 will be connected across the secondary winding of the current transformer 401 so that the voltage across burden resistor 402 is proportional to the output of the current transformer 401. The higher the value R1 of the burden resistor 402, the higher will be the voltage across the secondary winding of current transformer 401. In particular, the voltage across the burden resistor 402 Vout will typically be:

$$V\text{out}=1/N451 I\text{load}/N401 R1$$

in which N451 is the turns ratio of the current transformer(s) 451 that lead(s) to the converter circuit, N401 is the turns ratio of the current transformer 401, Iload is the load current through the primary coil of the current transformer 451, and R1 is the rated resistance of the burden resistor 402. In practice R1 should not be selected to be a resistance level that is so high that it will make the current transformer 401 output be non-linear. In the present applications the resistance level can generally stay below problematic levels while still yielding sufficient output voltage to be detectable and measurable by the trip circuit.

The output voltage then passes across a passive differentiator that includes a capacitor 403 (C1) and resistor 404 (R2). because the passive differentiator includes a capacitor, it will be of the type that is a capacitive differentiator. With properly selected values for capacitor 403 and resistor 404, the output of the passive differentiator will have a rate of change that is proportional to the rate of change (the time derivative) of the input. The voltage across resistor 404 will thus be the output of the converter circuit 400, and it will be passed to the trip unit 461 (ETU) with a di/dt proportional behavior that is similar to that of a Rogowski coil.

For example, in a circuit with 4000:1 transformer 451, a 688Ω resistor 402, a 0.1 µF capacitor 403 (C1), a 500Ω resistor 404 (R2), and a current transformer 401 having a current ratio of 36.4:1, the current passed to the trip unit 461 may be at least 0.089 mV/A at 60 Hz, although the invention is not limited to such embodiments. The trip unit may be an electronic trip unit (ETU) of a type having a processor that senses voltage received, and calculates current as a function of the input voltage. With the converter circuit described above, no integrated circuit—indeed no component requiring an additional power source—is needed to supply sufficient voltage for operation of the ETU.

Optionally, although not required, an inductor 408 may be electrically connected in in series with the resistor 404 of the passive differentiator. One end of inductor 408 may be electrically connected to the circuit reference, and the other end of inductor 408 may be electrically connected to the resistor 404 of the passive differentiator. The voltage output by a Rogowski coil is typically 90° ahead of the phase of the coil's output current, but the differentiator may only be able to maintain this phase shift over a narrower range of frequencies. The inductor 408 introduces a phase shift to compensate by phase lost at higher frequencies in the differentiator. As an additional option, an active circuit such as an operational amplifier may be included to eliminate the interactions between impedances in each part of the circuit.

The rated values of the components of a system such as that described above may be functions of the particular application. For example, the R2 value of resistor 404 should yield an output impedance that is relatively small relative to the input impedance of the trip unit 461 (ETU), for example R2 may be 500Ω or less. The capacitor 403 value C1 may be 0.1 µF or less in some applications. In order to allow the differentiator to operate over a wider range of frequencies, the resistance of R2 should be substantially less than the impedance of C1 at the frequencies of interest, which in some embodiments may be in a range of about 60 Hz to about 660 Hz. At frequencies near the high end of this range, "substantially less" means that the impedance of C1 should be at least 4 times the resistance of R2. As the frequencies move lower toward 60 Hz, "substantially less" will mean an even greater gap than at least 4×. By way of example, in the configuration of FIG. 4, the values may be R1=688Ω, R2=500Ω and C1=0.1 µF (which would correspond to a capacitive impedance of about 26525.8 Ω at 60 Hz).

Figure 5:
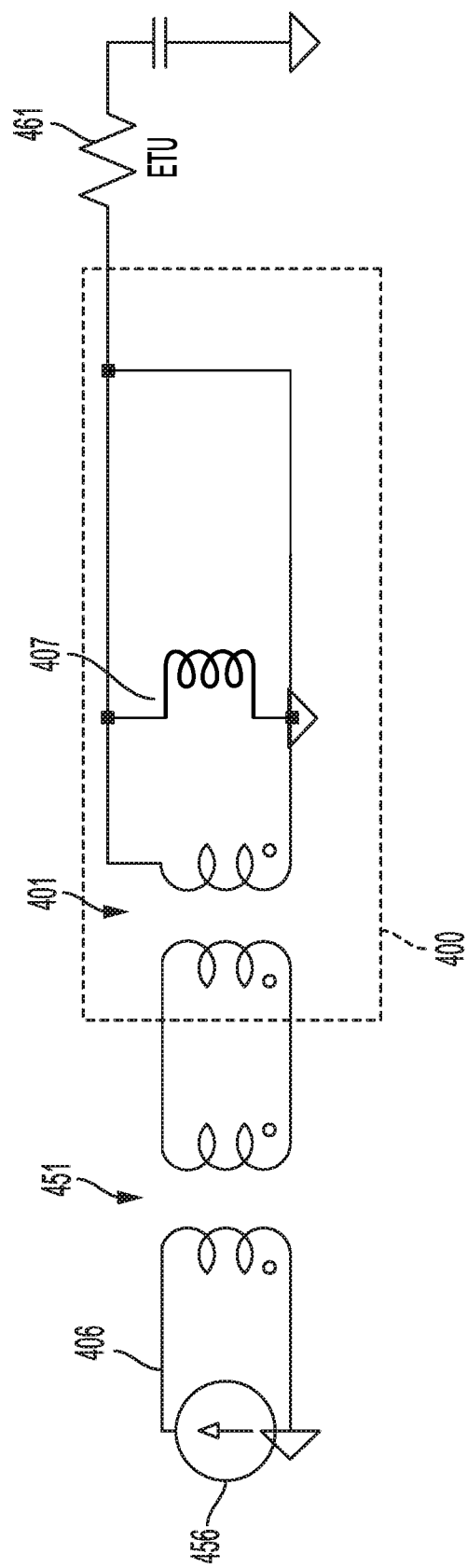
FIG. 5 illustrates a variant of the example converter circuit of FIG. 4.

In some embodiments, as shown in FIG. 5 instead of using a capacitive differentiator, the system may simply incorporate an inductor 407 that is connected in parallel with the secondary of transformer 401. However, the capacitive differentiator may have a wider potential application, since the inductor required for such a configuration may need to be physically large.

When a converter circuit such as that described above is used, the circuit will output a voltage that is proportional to the time rate of change of the circuit's input signal. The trip unit may then, with an integrator circuit or microcontroller, use the time rate of change to calculate a measurement of current, such as existing trip units that are designed for Rogowski coils already do.

The features and functions described above, as well as alternatives, may be combined into many other different systems or applications. Various alternatives, modifications, variations or improvements may be made by those skilled in the art, each of which is also intended to be encompassed by the disclosed embodiments.

The invention claimed is:

1. An electrical system comprising:
   a first power source;
   a first circuit breaker that is electrically connected to an output of the first power source;
   a first trip unit for the first circuit breaker;
   a first current transformer that is positioned to detect current passing through a neutral line that extends from the first power source; and
   a first converter circuit that is positioned to:
      receive a signal from an output of the first current transformer,
      convert the received signal to a first voltage signal, and send the first voltage signal to the first trip unit,
      wherein during operation the first voltage signal will have a voltage that is proportional to a time rate of change of the received signal,
   wherein the system is a main-tie-main system that also comprises:
      a second power source;
      a second circuit breaker that is electrically connected to an output of the second power source;
      a second trip unit for the second circuit breaker;
      a second current transformer that is positioned to detect current passing through a neutral line that extends from the second power source, and that has an output that is electrically connected to the second trip unit;
      a second converter circuit that is positioned to:
         receive a signal from the output of the second current transformer,
         convert the signal received from the output of the second current transformer to a second voltage signal, and
         send the second voltage signal to the second trip unit; and a third circuit breaker that is electrically connected to both the first power source and the second power source.

2. The system of claim 1, wherein the first converter circuit comprises:
an input component that is electrically connected to receive the first signal from the first current transformer;
a burden resistor that is electrically connected across a coil of the input component; and
a passive differentiator that is electrically connected across the burden resistor,
wherein:
the passive differentiator comprises a resistor and a capacitor, and
the output of the current converter is configured to deliver the first voltage signal from the passive differentiator during operation.

3. The system of claim 2, wherein:
the input component of the first converter circuit comprises a current transformer; and
the coil across which the burden resistor is electrically connected is a secondary winding of the current transformer.

4. The system of claim 2, wherein a resistance value of the resistor of the passive differentiator is substantially less than an impedance value of the capacitor of the passive differentiator at a given operating frequency.

5. The system of claim 2, wherein the first converter circuit further comprises an inductor that has one end that is electrically connected to a circuit reference and serves to add phase shift lost at a high end of an operating range.

6. The system of claim 2, wherein the first converter circuit does not require a power source to convert the deliver, from the passive differentiator during operation, the converted output voltage.

7. The system of claim 1, wherein:
the neutral lines that extend from the first power source and the second power source are electrically connected to each other; and
each of the first and second converter circuits is electrically connected to each of the neutral lines.

8. A converter circuit for receiving signals from one or more current transformers and outputting a signal to a circuit breaker trip unit, the converter circuit comprising:
an input component that is electrically connected to receive an output signal from each of one or more current transformers of a circuit breaker;
a burden resistor that is electrically connected across a coil of the input component;
a passive differentiator that is electrically connected across the burden resistor, wherein the passive differentiator comprises a resistor and a capacitor; and
an output that is configured to deliver, from the passive differentiator during operation, a converted output voltage that is proportional to a time rate of change of a signal that is received by the input component, such that the converted output voltage does not need to be processed by an integrated circuit in order for the trip unit to make a determination to output a trip signal.

9. The converter circuit of claim 8, wherein the input component comprises a current transformer, and the coil of the input component across which the burden resistor is electrically connected comprises a secondary coil of the current transformer.

10. The converter circuit of claim 8, wherein a resistance value of the resistor of the passive differentiator is substantially less than an impedance value of the capacitor of the passive differentiator at a given operating frequency.

11. The converter circuit of claim 8, further comprising an inductor that has one end that is electrically connected to a circuit reference and serves to add phase shift lost at a high end of an operating range of the converter circuit.

12. The converter circuit of claim 8, wherein:
the circuit breaker is a component of a main-tie-main system;
the input component is electrically connected to a plurality of current transformers of the main-tie-main system; and
each of the current transformers of the main-tie-main system is configured to detect current output by one or more neutral lines of a corresponding source that is electrically connected to the main-tie-main system.

13. The converter circuit of claim 8, wherein the converter circuit does not require a power source to deliver, from the passive differentiator during operation, the converted output voltage.

14. An electrical system having a main-tie-main configuration, the system comprising:
a first power source;
a first circuit breaker that is electrically connected to an output of the first power source;
a first trip unit for the first circuit breaker;
a first current transformer that is positioned to detect current passing through a neutral line that extends from the first power source;
a second power source;
a second circuit breaker that is electrically connected to an output of the second power source;
a second trip unit for the second circuit breaker;
a second current transformer that is positioned to detect current passing through a neutral line that extends from the second power source, and that has an output that is electrically connected to the second trip unit;
a third circuit breaker that is electrically connected to both the first power source and the second power source;
a first converter circuit that is positioned to:
receive signals from the first and second current transformers,
sum and convert the signals received from the output of the first and second current transformers to a first voltage signal, and
send the first voltage signal to the first trip unit, wherein during operation the first voltage signal will have a rate of change that is proportional to a rate of change of the signals received by the first converter circuit; and
a second converter circuit that is positioned to:
receive signals from the first and second current transformers,
sum and convert the signals received from the output of the first and second current transformers to a second voltage signal, and
send the second higher voltage signal to the second trip unit, wherein during operation the second voltage signal will have a rate of change that is proportional to a rate of change of the signals received by the second converter circuit.

15. The system of claim 14, wherein each of the converter circuits comprises:
an input component that is electrically connected to receive the output signal from the applicable current transformer;

a burden resistor that is electrically connected across a coil of the input component; and a passive differentiator that is electrically connected across the burden resistor, wherein:

the passive differentiator comprises a resistor and a capacitor, and the output of the converter circuit is configured to deliver the applicable voltage signal from the passive differentiator during operation.

16. The system of claim 15, wherein:

the neutral lines that extend from the first power source and the second power source are electrically connected to each other; and each of the first and second converter circuits is electrically connected to each of the neutral lines.

17. The system of claim 16, wherein each converter circuit further comprises an inductor that has one end that is electrically connected to a circuit reference and serves to add phase shift lost at a high end of an operating range of the converter circuit.

18. The system of claim 15, wherein:

the input component of the each converter circuit comprises a current transformer; and the coil across which the burden resistor is electrically connected in each converter circuit is a secondary winding of the current transformer of that converter circuit.

19. The system of claim 15, wherein a resistance value of the resistor of the passive differentiator of each converter circuit is substantially less than an impedance value of the capacitor of the passive differentiator of that converter circuit at a given operating frequency.

20. The system of claim 15, wherein neither of the converter circuits requires a power source to convert the signal that it receives to the applicable voltage signal.

21. A converter for receiving signals from one or more current transformers and outputting a signal to a circuit breaker trip unit, the converter comprising:

an input component that is electrically connected to receive an output signal from each of one or more current transformers of a circuit breaker; and an inductor that is electrically connected across a coil of the input component;

wherein the converter is configured to deliver, during operation, a converted output voltage that is proportional to time rate of change of current that is received by the input component, such that the converted output voltage does not need to be processed by an integrated circuit in order for the trip unit to make a determination to output a trip signal.

22. The converter of claim 21, wherein the circuit comprises a passive differentiator.

* * * * *